United States Patent
Corzine et al.

(10) Patent No.: US 6,188,711 B1
(45) Date of Patent: Feb. 13, 2001

(54) POLARIZATION-CONTROLLED VCSELS USING EXTERNALLY APPLIED UNIAXIAL STRESS

(75) Inventors: Scott W. Corzine, Sunnyvale; Michael R. T. Tan, Menlo Park; Albert T. Yuen, Los Altos; Dubravko I. Babic, Sunnyvale, all of CA (US)

(73) Assignee: Agilent Technologies, Inc., Palo Alto, CA (US)

(*) Notice: Under 35 U.S.C. 154(b), the term of this patent shall be extended for 0 days.

(21) Appl. No.: 08/993,006

(22) Filed: Dec. 18, 1997

(51) Int. Cl.$^7$ .................................................. H01S 5/12
(52) U.S. Cl. .............................. 372/96; 372/36; 372/46
(58) Field of Search ........................ 372/45, 46, 96, 372/36, 27, 29.02, 18

(56) References Cited

U.S. PATENT DOCUMENTS

| | | | |
|---|---|---|---|
| 4,474,422 | 10/1984 | Kitamura | 350/6.8 |
| 5,331,654 | 7/1994 | Jewell et al. | 372/45 |
| 5,345,462 | 9/1994 | Choquette | 372/96 |
| 5,394,423 | 2/1995 | Kasahara | 372/45 |
| 5,412,680 | 5/1995 | Swithun et al. | 372/96 |
| 5,416,044 | 5/1995 | Chino et al. | 437/129 |
| 5,493,577 | 2/1996 | Choquette et al. | 372/96 |
| 5,953,362 | * 9/1999 | Pamulapati et al. | 372/96 |
| 6,002,705 | * 12/1999 | Thornton | 372/96 |

FOREIGN PATENT DOCUMENTS

| | | | |
|---|---|---|---|
| 0544002A1 | 6/1993 | (EP) | G03G/15/04 |
| 0709939A | 5/1996 | (EP) | H01S/3/085 |
| 0 935 321 | 8/1999 | (EP) | H01S/3/18 |
| 6-177480 | 6/1994 | (JP) | 372/96 |
| 022706 | 1/1995 | (JP) . | |
| 09064462 | 3/1997 | (JP) . | |
| WO 98/53537 | 11/1998 | (WO) | H01S/3/085 |

OTHER PUBLICATIONS

T. Mukaihara et al., "Engineered Polarization Control of GaAS/AlGaAs Surface–Emitting Lasers by Anisotropic Stress from Elliptical Etched Substrate Hole", IEEE Photonics Technology Letters, vol. 5, No. 2, Feb. 1993, pp. 133–135.

T. Yoshikawa et al., "Complete Polarization Control of 8X8 Vertical–Cavity Surface–Emitting Laser Matrix Arrays", Applied Physics Letters, vol. 66, No. 8, Feb. 20, 1995, pp. 908–910.

(List continued on next page.)

*Primary Examiner*—James W. Davie

(57) ABSTRACT

A Vertical Cavity Surface-Emitting Laser (VCSEL) assembly in which the polarization is locked to a specified direction that is the same for all VCSELs. A VCSEL according to the present invention includes a VCSEL having a top mirror region, a bottom mirror region, a light generation region between the top and bottom mirror regions, a conducting substrate and a bottom electrode. The bottom mirror region is sandwiched between the conducting substrate and the light generation region, and the conducting substrate is sandwiched between the bottom electrode and the bottom mirror region. The assembly also includes a mounting substrate having top and bottom surfaces, the VCSEL being mechanically coupled to the mounting substrate. The mounting substrate includes a means for defining a first axis. The assembly includes a means for causing the mounting substrate to flex about the first axis thereby inducing a strain in the light generation region which locks the polarization into a mode determined by the first axis. In one embodiment of the present invention, the first axis is defined by a channel in the mounting substrate. The mounting substrate is caused to flex by the application of an adhesive layer applied between the mounting substrate and a mounting surface. The adhesive layer has a thermal coefficient of expansion different from the mounting substrate. In another embodiment, trenches whose direction defines the first axis are located in the top mirror region of the VCSEL.

10 Claims, 3 Drawing Sheets

OTHER PUBLICATIONS

T. Wipiejewski et al., "Characterization of Two–Sided Output Vertical–Cavity Laser Diodes by External Optical Feedback Modulation", Proceedings of the Lasers and Electro0Optics Society Annual Meeting, San Jose, California, Nov. 15–18, 1993, pp. 564–565.

Chouquette et al., "Control of Vertical–Cavity Laser Polarization with Anisotropic Transverse Cavity Geometries", IEEE Photonics Technology Letters, vol. 6, No. 1, Jan. 1, 1994, pp. 40–42.

Adams, C. S. et al., Stress–Dependent Bahavior of INGAAP Semicondsuctor Diode Lasers, Conference on Lasers and Electro Optics, Anaheim, Apr. 25–29, 1988, No. Conf. 8, Apr. 25, 1988.

Eliseev, P. G. et al., Reduction of the Threshold Current of ANGAASP/INP Heterolasers by Unidirectional Compression, Soviet Journal of Quantum Electronics, vol. 14, No. 8, Aug. 1984, pp. 1120–1121.

* cited by examiner

POLARIZATION-CONTROLLED VCSELS USING EXTERNALLY APPLIED UNIAXIAL STRESS

FIELD OF THE INVENTION

The present invention relates to lasers, and more particularly, to an improved method for controlling the polarization of surface emitting laser diodes in an array of such diodes.

BACKGROUND OF THE INVENTION

Vertical Cavity Surface-Emitting Lasers (VCSELs) are currently being considered for use in CD-ROM drives, DVD heads, and laser printers. For all of these applications, the optics which deliver the laser power to the disc or drum have a certain degree of polarization sensitivity, such that if the polarization of the light source drifts, the drift will translate into detrimental output power variations. In addition, the optics can be complex enough in these systems that knowledge of the polarization direction is necessary to optimize the optics design. For these reasons, the light sources for such applications must have a stable fixed polarization, and the polarization direction must be the same for every laser fabricated.

VCSELs often have a fixed polarization while operating in the fundamental mode. However, the output light is, in general, a mixture of polarization states with ratio of the light in the fixed polarization state to the other polarization state typically of the order of 10:1. In addition, the polarization state is not always stable. For example, the polarization direction can often flip by 90° as current is increased beyond threshold and as the laser switches between modes.

In addition to these instabilities, the polarization tends to be randomly oriented from device to device. This is due to the circular symmetry of typical VCSEL designs. Various methods have been applied to lock the polarization direction by adding some asymmetry to the cavity such as elliptical current confinement, or elliptical optical confinement, or both. However, these solutions have met with limited success in that the percentage of finished devices that remain locked in the desired polarization direction is significantly less than 100%. In addition, the beam shape is altered by some of the methods from the desirable circular output beam into a less desirable elliptical shape.

Broadly, it is the object of the present invention to provide an improved VCSEL.

It is a further object of the present invention to provide a VCSEL in which the output light is locked into one polarization state.

It is a still further object of the present invention to provide a VCSEL in which the polarization state is the same for all devices.

These and other objects of the present invention will become apparent to those skilled in the art from the following detailed description of the invention and the accompanying drawings.

SUMMARY OF THE INVENTION

The present invention is a Vertical Cavity Surface-Emitting Laser (VCSEL) assembly in which the polarization is locked to a specified direction that is the same for all VCSELs. A VCSEL according to the present invention includes a VCSEL having a top mirror region, a bottom mirror region, a light generation region between the top and bottom mirror regions, a conducting substrate and a bottom electrode. The bottom mirror region is sandwiched between the conducting substrate and the light generation region, and the conducting substrate is sandwiched between the bottom electrode and the bottom mirror region. The assembly also includes a mounting substrate having top and bottom surfaces, the VCSEL being mechanically coupled to the mounting substrate. The mounting substrate includes a means for defining a first axis. The assembly includes a means for causing the mounting substrate to flex about the first axis thereby inducing a strain in the light generation region which locks the polarization into a mode determined by the first axis. In the preferred embodiment of the present invention, the first axis is defined by a channel in the mounting substrate. The mounting substrate is caused to flex by the application of an adhesive layer applied between the mounting substrate and a mounting surface. The adhesive layer has a thermal coefficient of expansion different from the mounting substrate. In one embodiment, the adhesive layer includes a solder layer that fills the channel. Upon cooling, the solder layer contracts causing the mounting substrate to flex. In another embodiment, trenches whose direction defines the first axis are located in the top mirror region of the VCSEL.

DETAILED DESCRIPTION OF THE INVENTION

Figure 1:
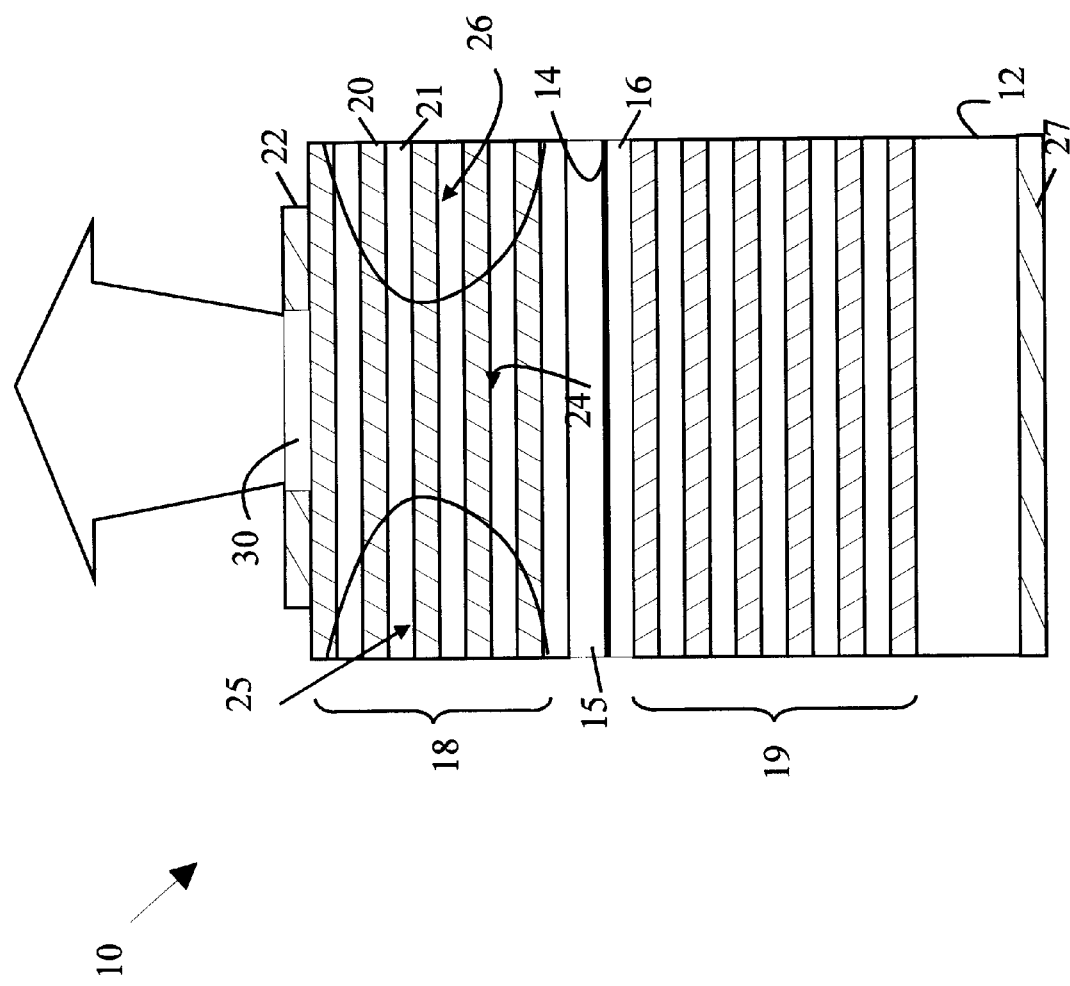
FIG. 1 is a cross-sectional view of a conventional VCSEL.

The present invention may be more easily understood with reference to FIG. 1 which is a cross-sectional view of a conventional VCSEL 10. Since construction of VCSELs is well known to those skilled in the laser arts, it will not be described in detail here. For the purposes of this discussion, it is sufficient to note that VCSEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth. Substrate 12 is an n-type semiconductor in the example shown in FIG. 1.

The active region is typically constructed from one or more quantum wells of InGaAs, GaAs, AlGaAs, (Al)GaInP, GaInAsP or InAlGaAs which is separated from mirror regions 18 and 19 by spacers 15 and 16, respectively. The choice of material depends on the desired wavelength of the light emitted by the VCSEL and other desired VCSEL properties. In addition, devices based on bulk active regions are known to the art. This layer 14 may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light. The stacks form Bragg mirrors. The stacks are typically constructed from alternating layers of AlAs and GaAs or AlGaAs. To obtain the desired reflectivity, 20 to 30 pairs of layers are typically required. The layers in the upper mirror region 18 are typically doped to be p-type semiconductors and those in the lower mirror region 19 are doped to be n-type semiconductors. Substrate 12 is preferably n-type. Bottom electrode 27 is preferably an n-ohmic contact. However, n-i-p diode structures may also be constructed by growing the structures on a p-substrate or a semi-insulating substrate with a p-layer deposited thereon.

The current flow between electrodes 22 and 27 is confined to region 24 by implanting regions 25 and 26 to convert the regions to regions of high resistivity. This is typically accomplished by implanting with hydrogen ions.

It should be noted that VCSEL 10 is not shown to scale in FIG. 1. In particular, the mirror regions and active regions have been expanded to provide clarity in the drawing. In practice, the thickness of region 12 is typically 150 $\mu$m compared to about 10 $\mu$m for the mirror and active regions. Window 30 in top electrode 22 is approximately 10 $\mu$m in diameter while bottom electrode 27 covers the bottom of the substrate.

The present invention is based on the observation that uniaxial compressive stress enhances the optical gain for polarizations aligned along the stress axis. In fact for bulk active regions, compressive stress applied along a [100] direction enhances the optical gain for polarizations along the stress axis by as much as ~1 $cm^{-1}$/[$N/mm^2$] relative to the optical gain for orthogonally polarized directions. In the present invention, the stress is externally introduced with a predetermined direction and magnitude sufficient to completely lock the polarization direction along the stress axis. It has been found experimentally that pressing down on a long thin semiconductor chip with a VCSEL on top applies enough compressive stress to the surface of the chip to lock the polarization of the VCSEL to the stress axis. It is estimated that the applied [110] directed stress required to lock the polarization is on the order of 10–100 $N/mm^2$, and the corresponding strain in the crystal is on the order of 0.01–0.05%.

This level of stress can be introduced by means of bonding the chip to a surface with a material which shrinks more than the VCSEL chip after the bonding process. Examples include solder, conductive epoxy, gold plating, and even dielectric films. To provide a uniaxial stress, the bowing of the chip must be constrained to one axis. In the preferred embodiment of the present invention, this is accomplished by removing a portion of the wafer on which the chip is constructed.

Figure 2:
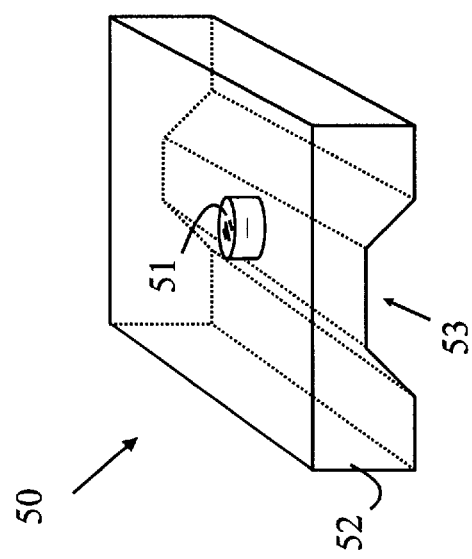
FIG. 2 is a perspective view of a chip having a VCSEL constructed on a wafer in which the bottom side of the wafer has been partially cut away to form a slot having an axis along which the stress is to be induced.

Refer now to FIG. 2 which is a perspective view of a chip 50 having a VCSEL 51 constructed on a wafer 52 in which the bottom side of wafer 52 has been partially cut away to form a slot 53 having an axis along which the stress is to be induced. The depth of slot 53 is typically 75 $\mu$m and the chip thickness is typically 150 $\mu$m in the preferred embodiment of the present invention. The slot is preferably created by etching channels on the backside of the wafer before cleaving the wafer into chips. The slot renders the chip more flexible in one direction. When the bonding agent shrinks, the chip is forced to bend in a direction determined by the slot axis.

Figure 3:
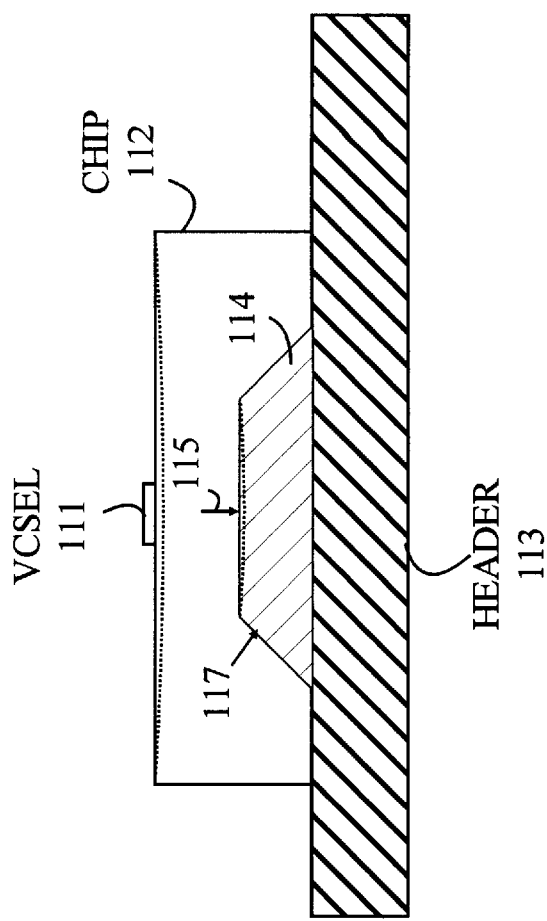
FIG. 3 is a cross-sectional view of a chip having a VCSEL mounted on a header by a solder joint.

Refer now to FIG. 3 which is a cross-sectional view of a chip 112 having a VCSEL 111 mounted on a header 113 by a solder joint 114. When the solder joint is applied, the solder is molten at a temperature of typically 275° C. As the solder cools and solidifies, the solder joint shrinks thus applying force to the chip in the direction shown by arrow 115. The solder also provides the electrical contact between header 113 and the bottom electrode of VCSEL 111. A gold-tin solder is preferred. The resulting stress pattern results in a maximum perpendicular-to-channel stress which is significantly more than the required 10–100 $N/mm^2$ stress required to provide polarization locking. It has been found experimentally that polarization ratios of greater than 100:1 may be obtained utilizing the preferred embodiment of the present invention described above.

Alternatively, the VCSEL may be mounted on the header by a conductive epoxy joint. For example, a silver epoxy may be used. After the joint is applied, the device is baked at a temperature of typically 120° C. for about 30 minutes to cure the epoxy joint. The epoxy joint shrinks as it cures, which applies a force to the chip in a manner similar to that described above.

In the preferred embodiment of the present invention, electrode 27 and substrate 12 shown in FIG. 1 are incorporated into chip 112. Chip 112 is preferably constructed from an n-type semiconductor so that it is conductive. Chip 112 replaces substrate 12 shown in FIG. 1. A metallic layer 117 is then applied to the bottom surface of chip 112 after the channel is etched in the bottom layer. This metallic layer serves the function of electrode 27.

Alternatively, the VCSEL may be constructed as shown in FIG. 1 with electrode 27 on the top surface of chip 112. In this case, the connection to electrode 27 may be made by metallic conductors on the surface of chip 112 and chip 112 can then be constructed from a non-conducting substrate.

Figure 4:
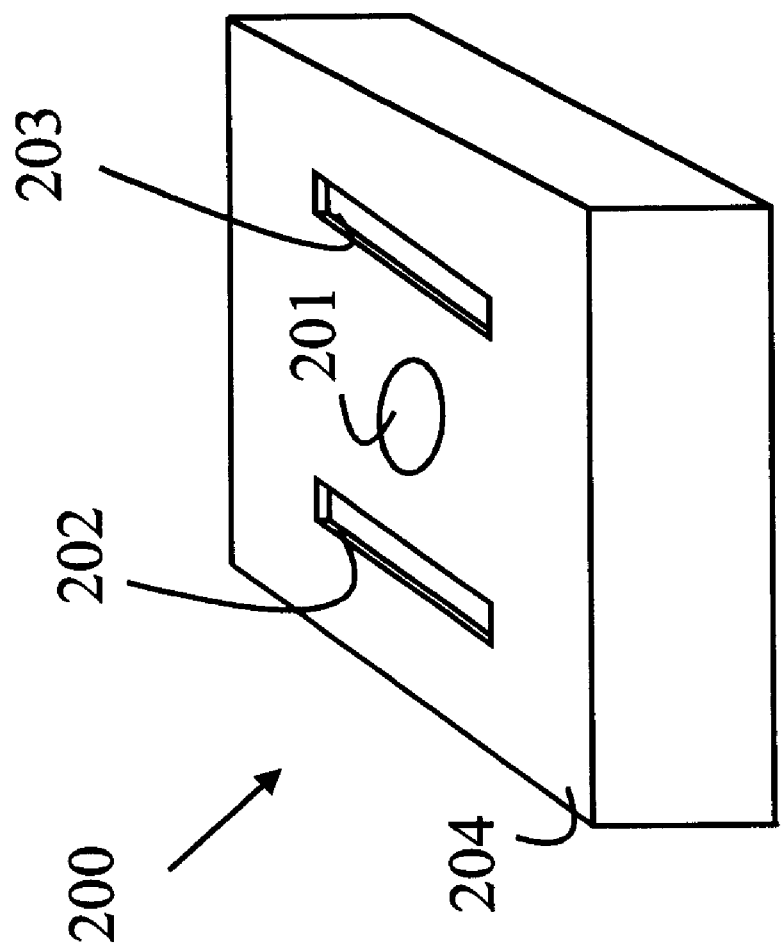
FIG. 4 is a perspective view of a chip that includes another embodiment of a VCSEL according to the present invention.

Refer now to FIG. 4 which is a perspective view of a chip 200 having a VCSEL 201 constructed thereon. Two trenches shown at 202 and 203 are etched on either side of VCSEL 201. The orientation of the trenches defines the orientation of the stress pattern applied to VCSEL 201. The trenches may be filled with a material that has a coefficient of thermal expansion that is different from that of the substrate. For example the trenches may be filled with solder, gold, or dielectric. The fill material is applied at a temperature well above the operating temperature of VCSEL 201. As the fill material cools a force is applied to the light generation region of the VCSEL. The direction of the force will depend on whether the fill material has a coefficient of thermal expansion that is greater than or less than that of the substrate.

Embodiments in which the trenches are not filled have also been found to operate successfully to provide polarization locking. In these embodiments, trenches having a width of 1–10 $\mu$m, a length of approximately twice the width of the VCSEL, and a depth of approximately the thickness of the top mirror region have been found to provide polarization locking. Deeper trenches also provide the desired polarization locking. The trenches may be etched from 1–10 $\mu$m from the VCSEL.

The above described embodiments have assumed that the VCSEL has not been constructed in a manner in which one direction of polarization is favored. However, it should be noted that the present invention may also be used in conjunction with systems which provide imperfect polarization locking to provide a VCSEL with a very high degree of polarization locking. For example, it is known that one can provide VCSELs with partial polarization locking by constructing the VCSEL on a mis-oriented substrate. While the polarization observed with such VCSELs tends to be determined by the substrate orientation, this method is not sufficiently reliable to assure that all of the VCSELs have the same direction of polarization after all of the fabrication and packaging operations have been completed. However, the combination of mis-oriented substrate construction and trenches along the VCSEL provides reliable polarization locking.

Various modifications to the present invention will become apparent to those skilled in the art from the foregoing description and accompanying drawings. Accordingly, the present invention is to be limited solely by the scope of the following claims.

What is claimed is:

1. A Vertical Cavity Surface-Emitting Laser (VCSEL) assembly comprising:

a VCSEL comprising a top mirror region, a bottom mirror region, a light generation region between said top and bottom mirror regions, a conducting substrate and a bottom electrode, said bottom mirror region being sandwiched between said conducting substrate and said light generation region and said conducting substrate being sandwiched between said bottom electrode and said bottom mirror region; and strain inducing means for inducing a strain in said light generation region along a first axis.

2. The VCSEL assembly of claim 1 further comprising a mounting substrate having top and bottom surfaces, said VCSEL being mechanically coupled to said mounting substrate, said mounting substrate including means for defining said first axis.

3. The VCSEL assembly of claim 2 wherein said conducting substrate is part of said mounting substrate.

4. A Vertical Cavity Surface-Emitting Laser (VCSEL) assembly comprising:

a VCSEL comprising a top mirror region, a bottom mirror region, a light generation region between said top and bottom mirror regions, a conducting substrate and a bottom electrode, said bottom mirror region being sandwiched between said conducting substrate and said light generation region and said conducting substrate being sandwiched between said bottom electrode and said bottom mirror region; and strain inducing means for inducing a strain in said light generation region along a first axis, wherein said strain inducing means comprises a trench in said top mirror region having an axis defined by said first axis.

5. The VCSEL assembly of claim 4 wherein said trench is filled with a material having a different coefficient of thermal expansion than said top mirror region.

6. A Vertical Cavity Surface-Emitting Laser (VCSEL) assembly comprising:

a VCSEL comprising a top mirror region, a bottom mirror region, a light generation region between said top and bottom mirror regions, a conducting substrate and a bottom electrode, said bottom mirror region being sandwiched between said conducting substrate and said light generation region and said conducting substrate being sandwiched between said bottom electrode and said bottom mirror region;

strain inducing means for inducing a strain in said light generation region along a first axis; and a mounting substrate having top and bottom surfaces, said VCSEL being mechanically coupled to said mounting substrate, said mounting substrate including means for defining said first axis, wherein said strain inducing means comprises means for causing said mounting substrate to flex about said first axis thereby inducing a strain in said light generation region.

7. The VCSEL assembly of claim 6 wherein said means for defining a first axis comprises a channel in said mounting substrate having an axis parallel to said first axis.

8. The VCSEL assembly of claim 7 wherein said means for causing said mounting substrate to flex comprises an adhesive layer applied between said mounting substrate and a mounting surface wherein said adhesive layer has a thermal coefficient of expansion different from said mounting substrate.

9. The VCSEL assembly of claim 8 wherein said adhesive layer comprises a solder layer that fills said channel.

10. The VCSEL assembly of claim 8 wherein said adhesive layer comprises a conductive epoxy layer that fills said channel.

* * * * *